United States Patent [19]

Calligaro et al.

[11] Patent Number: 5,701,265
[45] Date of Patent: Dec. 23, 1997

[54] SERIAL DICHOTOMIC METHOD FOR SENSING MULTIPLE-LEVEL NON-VOLATILE MEMORY CELLS, AND SENSING CIRCUIT IMPLEMENTING SUCH METHOD

[75] Inventors: Cristiano Calligaro, Pavia; Vincenzo Daniele; Roberto Gastaldi, both of Milan; Alessandro Manstretta; Guido Torelli, both of Pavia, all of Italy

[73] Assignee: SGS-Thomson Microelectronics S.r.l., Agrate Brianza, Italy

[21] Appl. No.: 593,650

[22] Filed: Jan. 29, 1996

[30] Foreign Application Priority Data

Jan. 27, 1995 [EP] European Pat. Off. ............ 95830023

[51] Int. Cl.⁶ .................................................. G11C 11/34
[52] U.S. Cl. ..................... 365/185.03; 365/185.21; 365/185.33
[58] Field of Search ............................... 365/94, 103, 104, 365/189.07, 210, 239, 240, 189.12, 185.03, 185.2, 185.21, 185.33

[56] References Cited

U.S. PATENT DOCUMENTS

| 4,809,224 | 2/1989 | Suzuki et al. | 365/94 |
|---|---|---|---|
| 4,964,079 | 10/1990 | Devin | 365/185.03 |
| 5,241,494 | 8/1993 | Blyth et al. | 365/210 |
| 5,563,836 | 10/1996 | Saito et al. | 365/210 |

FOREIGN PATENT DOCUMENTS

| 0 349 775 | 1/1990 | European Pat. Off. | G11C 11/56 |
|---|---|---|---|
| 90/12400 | 10/1990 | WIPO | G11C 11/00 |

OTHER PUBLICATIONS

Morris, Noel M., *Logic Circuits*, McGraw-Hill Book Company, Maidenhead, UK, 1983, pp. 238–249.

Rich, David, A., "A Survey of Multivalued Memories," *IEEE Transactions on Computers*, C-35(2):99–106, Feb. 1986.

Bauer, M., et al., "A Multilevel-Cell 32Mb Flash Memory," *Digest of Technical Papers*, IEEE International Solid-State Circuits Conference, Feb. 16, 1995, pp. 119, 132–133, 351.

*Primary Examiner*—David C. Nelms
*Assistant Examiner*—Trong Quang Phan
*Attorney, Agent, or Firm*—David V. Carlson; Seed and Berry LLP

[57] ABSTRACT

A serial dichotomic method for sensing multiple-level non-volatile memory cells which can take one of $m=2^n$ ($n \geq 2$) different programming levels, provides for biasing a memory cell to be sensed in a predetermined condition, so that the memory cell sinks a cell current with a value belonging to a plurality of m distinct cell current values, and for: a) comparing the cell current with a reference current which has a value comprised between a minimum value and a maximum value of said plurality of m cell current values, thus dividing said plurality of cell current values into two sub-pluralities of cell current values, and determining the sub-plurality of cell current values to which the cell current belongs; b) repeating the step a) until the sub-plurality of cell current values to which the cell current belongs comprises only one cell current value, which is the value for the current of the memory cell to be sensed.

28 Claims, 5 Drawing Sheets

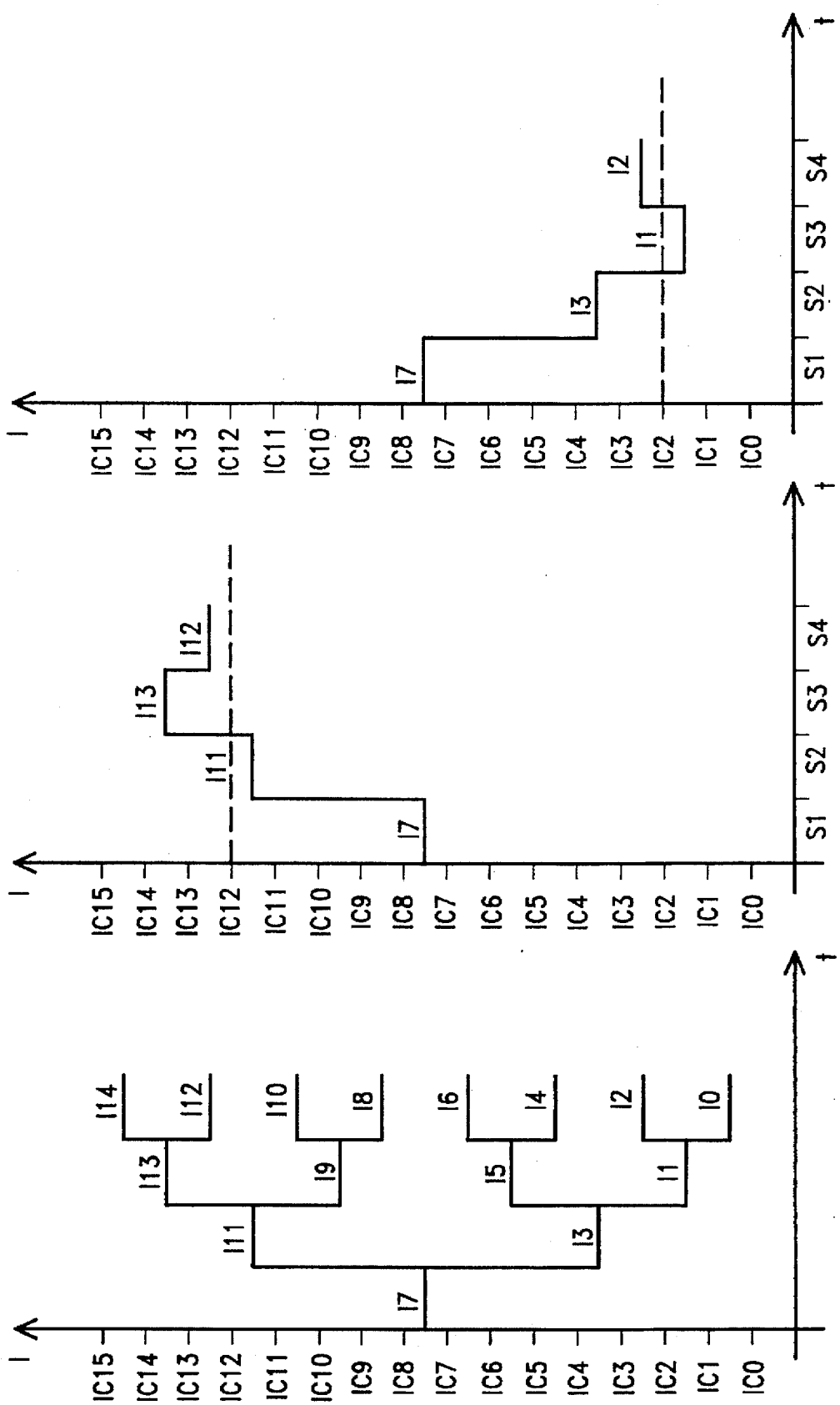

Fig.12
| CMP | CMPN | tn Q2 | Q1 | Q0 | tn+1 Q2 | Q1 | Q0 | OUT1 | OUT0 |
|---|---|---|---|---|---|---|---|---|---|
| 0 | 1 | 0 | 1 | 0 | 1 | 0 | 0 | X | X |
| 1 | 0 | 0 | 1 | 0 | 0 | 0 | 1 | X | X |
| 0 | 1 | 1 | 0 | 0 | 0 | 1 | 0 | 1 | 1 |
| 1 | 0 | 1 | 0 | 0 | 0 | 1 | 0 | 1 | 0 |
| 0 | 1 | 0 | 0 | 1 | 0 | 1 | 0 | 0 | 1 |
| 1 | 0 | 0 | 0 | 1 | 0 | 1 | 0 | 0 | 0 |
Fig.13
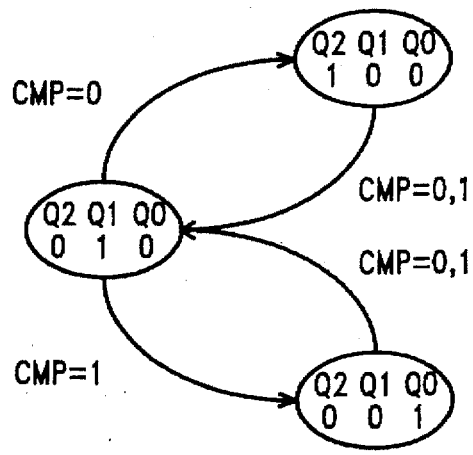
Fig.14
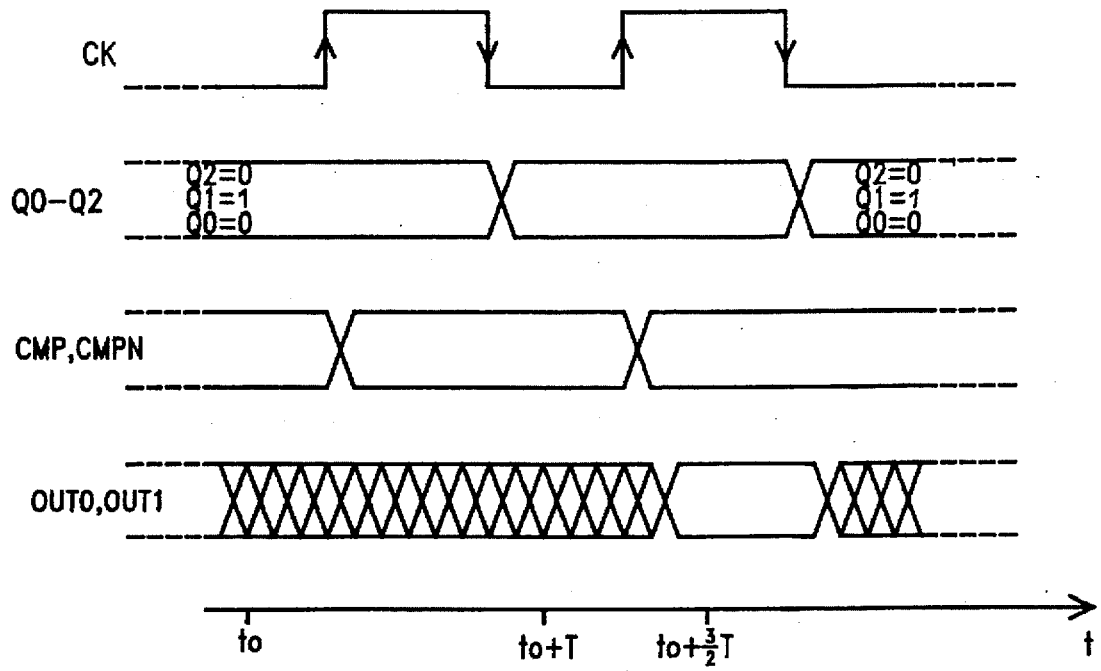

SERIAL DICHOTOMIC METHOD FOR SENSING MULTIPLE-LEVEL NON-VOLATILE MEMORY CELLS, AND SENSING CIRCUIT IMPLEMENTING SUCH METHOD

CROSS-REFERENCE TO RELATED APPLICATION

The following pending U.S. Patent Application by Cristiano Calligaro, Vincenzo Daniele, Roberto Gastaldi, Alessandro Manstretta, Nicola Telecco and Guido Torelli entitled: "Circuit and Method For Reading A Memory Cell That Can Store Multiple Bits of Data," application Ser. No. 08/592,939, which has the same effective filing date and ownership as the present application, and to that extent is related to the present application, and which is incorporated herein by reference.

TECHNICAL FIELD

The present invention relates to a serial dichotomic method for sensing multiple-level non-volatile memory cells, and to a sensing circuit for implementing such method.

BACKGROUND OF THE INVENTION

The market demand for non-volatile memories with higher and higher storage capacity is forcing the semiconductor manufacturers to a continuous effort in scaling the devices and in increasing the chip size.

As an additional possibility to increase the memories' capacities, it has been proposed of storing more than one bit per memory cell: a memory device with memory cells capable to store two or even four bits has a storage capacity two or, respectively, four times higher than that of a memory device with the same chip size but with memory cells capable to store only one bit each.

Non-volatile memory cells are generally represented by MOS field effect transistors; data can be programmed in non-volatile memory cells by changing the threshold voltage of the MOS field effect transistors: in the case of ROMs this is done during their fabrication, while in the case of EPROMs, EEPROMs and Flash EEPROMs the change in the threshold voltage is achieved by properly biasing the MOS field effect transistors to cause an injection of charges in a floating gate.

To determine the programming state of a non-volatile memory cell, i.e. to "read" or to "sense" the memory cell content, a fixed voltage VG is applied to the control gate of the MOS transistor: the programming state of the memory cell can thus be determined by detecting the position of the threshold voltage of the MOS transistor with respect to said fixed gate voltage.

In the most common case of non-volatile memory cells capable of storing only one bit of information, a memory cell can show two different programming states (logic levels), corresponding to two different threshold voltage values; in the following such a cell will be called a "two-level memory cell". The reading of the memory cells is performed by a so-called "sensing circuit", which delivers a voltage signal having two distinct possible values, corresponding to the two logic levels.

Two different sensing techniques are known: differential-mode sensing and reference-mode sensing. The first technique calls for differential memory cells, each memory cell comprising two MOS transistors with common source and drain but programmed in complementary states; due to the larger memory cell area with respect to a single transistor cell, this technique is suitable only for low to medium size memories (128 Kbits). The second technique provides for a differential sensing circuit using as a reference element a reference memory cell identical to the other memory cells, but with a predetermined threshold voltage; this technique is suitable for big memories (bigger than 1 Mbits).

In the case of non-volatile memory cells capable of storing more than one bit of information, a memory cell must be able to show $m=2^n$ distinct programming states or levels, where n represents the number of bits which can be stored in the memory cell; in the following, such a cell will be called a "multiple-level memory cell". As in the case of two-level cells, each level corresponds to a different value for the threshold voltage of the MOS transistor; the m different values for the threshold voltage are chosen inside the allowed threshold voltage range (i.e. the difference between the maximum and the minimum values for the threshold voltage) according to the sensing technique and to the physical parameters of the memory cells.

Two sensing techniques have been proposed for multiple-level memory cells: parallel-mode sensing and serial-mode sensing. Parallel-mode sensing is described in A. Bleiker, H. Melchior, "A Four-State EEPROM Using Floating-Gate Memory Cells", IEEE Journal of Solid State Circuits, vol. SC-22, No. 3, July 1987, pp. 460–463. This technique is the natural extension of the reference-mode sensing technique for two-level memory cells, and provides for generating m distinct predetermined voltage or current references, and for performing m simultaneous comparisons of such m distinct voltage or current references with a voltage or a current derived from the memory cell to be read.

The advantages of the parallel-mode sensing technique are its high speed and the independence of the sensing time from the programming state of the memory cell; a disadvantage is the large area required by the sensing circuit, since m distinct comparison circuits are necessary to perform the m simultaneous comparisons.

Serial-mode sensing is for example described in M. Horiguchi et al., "An Experimental large-Capacity Semiconductor File Memory Using 16-Levels/Cell Storage", IEEE Journal of Solid State Circuits, vol. SC-23, No. 1, February 1988, pp. 27–32. This technique provides for using one single voltage or current reference whose value can be made to vary according to a predetermined law; this variable reference voltage or current is then used for a series of successive comparisons, and it is varied to approximate the analogic level (in terms of threshold voltage or of current sunk by the memory cell) stored in the memory cell to be read. For example, the (constant) current sunk by the memory cell to be read is successively compared with a reference current (for example supplied by a digitally-driven current generator) which can take discrete values starting from a minimum (or maximum) value and successively increasing (or respectively decreasing); said discrete values are chosen in such a way as to fall between the different current values corresponding to the m programming levels of the memory cell, so that the result of a comparison is negative (or respectively positive) as long as the reference current is lower (or respectively higher) than the cell's current. The series of successive comparisons stops after the first positive (or respectively negative) result. As an alternative, it is possible to provide for a fixed reference current, and to vary the current sunk by the memory cell to be read by varying its gate voltage.

It appears that the time required to read a memory cell is not uniform, but depends on the programming level of the memory cell and on the starting value for the reference voltage or current (the sensing time depends on the distance between the programming level of the cell to be read and the starting value of the reference voltage or current): from a minimum of one to a maximum of m comparison steps can be necessary to determine the programming state of the memory cell. The sensing time becomes soon excessive with the increase of the number of bits stored in a single memory cell. However, serial-mode sensing is simple to be circuitally implemented, and the area required is little.

SUMMARY OF THE INVENTION

In view of the state of the prior art described, it is a first object of the present invention to provide a method for sensing multiple-level non-volatile memory cells overcoming the above-mentioned drawbacks.

A second object of the present invention is to provide a circuit for sensing multiple-level memory cells actuating such a method.

According to the present invention, such first object is achieved by means of a method for sensing multiple-level non-volatile memory cells which can take one programming level among a plurality of $m=2^n$ ($n>=2$) different programming levels, providing for biasing a memory cell to be sensed in a predetermined condition, so that the memory cell sinks a cell current with a value belonging to a plurality of m distinct cell current values, each cell current value corresponding to one of said programming levels, characterized by further providing for:
  a) comparing the cell current with a reference current which has a value comprised between a minimum value and a maximum value of said plurality of m cell current values, thus dividing said plurality of cell current values into two sub-pluralities of cell current values, and determining the sub-plurality of cell current values to which the cell current belongs;
  b) repeating the step a) until the sub-plurality of cell current values to which the cell current belongs comprises only one cell current value, which is the value for the current of the memory cell to be sensed.

The method of the present invention substantially provides for a so-called "dichotomic" successive approximations search: in a first step, the cell current is compared with a reference current that divides the interval of admissible cell currents in two parts or sub-intervals; the comparison determines in which of the two sub-intervals the cell current falls; in the second step, the cell current is compared with a reference current that further divides the sub-interval determined in the previous step in two parts, to determine the part of the sub-interval in which the cell current falls. The method involves recursion: at each step, the cell current is compared with a reference current that divides the interval of cell currents determined in the previous step in two parts, to determine the part of the interval in which the cell current falls. In the last step, only two possible cell currents are left: comparing the cell current with a reference current falling between these two possible cell currents determines the actual cell current. Preferably, the reference current value chosen in each step to be compared with the cell current is central with respect to the minimum and maximum admissible cell currents of the interval determined in the previous step and into which the cell current falls.

According to the method of the present invention, it can be shown that the programming state of a memory cell with $m=2^n$ different programming levels can be determined in n comparison steps, independently from the particular programming state of the memory cell. Thus, unlike the serial-mode sensing technique previously described, involving a serial sequential approach, the sensing time is thus constant and does not depend on the programming state of the memory cell to be sensed: this makes the sensing method of the present invention faster than the serial-mode sensing technique, especially for $n>2$.

Also according to the present invention, said second object is achieved by means of a circuit for sensing multiple-level memory cells which can take one programming level among a plurality of $m=2^n$ ($n>=2$) different programming levels, comprising biasing means for biasing a memory cell to be sensed in a predetermined condition, so that the memory cell sinks a cell current with a value belonging to a plurality of m distinct cell current values, each cell current value corresponding to one of said programming levels, and a current comparator for comparing the cell current with a reference current generated by a variable reference current generator, characterized in that it further comprises a successive approximation register supplied with an output signal of the current comparator and controlling the variable reference current generator, the successive approximation register comprising a sequential network which, starting from a predetermined initial state causing the reference current generator to generate a reference current with value comprised between a minimum value and a maximum value of said plurality of cell current values, evolves through a succession of states each one determined by the preceding state and by the output signal of the current comparator, each state of the sequential network causing the reference current generator to generate a respective reference current with value comprised between a minimum value and a maximum value of a sub-plurality of the cell current values to which the cell current belongs.

With respect to a sensing circuit implementing the parallel-mode sensing technique previously described, a sensing circuit according to the present invention occupies a smaller area, since it requires only one comparator, instead of m, and m−1 distinct reference currents.

Alternatively stated, the sequential network divides the plurality of program levels into a first portion and a second portion, compares the current draw of the memory cell, selects the portion in which the stored program level is contained as the plurality of program levels, and repeats the division, comparison and selection until the selected portion includes only one program level from the plurality of program levels.

BRIEF DESCRIPTION OF THE DRAWINGS

The features and advantages of the present invention will be made more evident by the following detailed description of some particular embodiments, described as non-limiting examples with reference to the annexed drawings, wherein:

FIG. 5 is similar to FIG. 2, but shows the case of a sixteen-level memory cell;

FIGS. 6 and 7 are similar to FIGS. 3 and 4, but for said case of a sixteen-level memory cell;

FIG. 12 is a truth table of the SAR and of the encoder of FIGS. 10 and 11;

FIG. 13 is a state-transition diagram of the SAR of FIG. 9;

FIG. 14 is a time diagram of various signals of the circuits of FIGS. 10 and 11;

DETAILED DESCRIPTION OF THE INVENTION

Figures 1A, 1B:
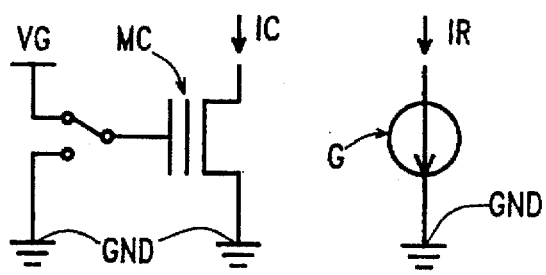
FIG. 1A schematically shows a multiple-level non-volatile memory cell in sensing conditions.
FIG. 1B shows a reference current generator used to sense the memory cell according to a method of the present invention.

The sensing method of the present invention will be described making reference to two particular cases: the first case relates to the sensing of a four-levels non-volatile memory cell (a cell capable of storing two bits of information), and the second case is directed to a sixteen-level non-volatile memory cell (a cell capable of storing four bits of information). In both cases, a memory cell MC to be read is biased with a fixed, predetermined control gate voltage VG (FIG. 1A); the memory cell MC shown in FIG. 1A is a floating-gate MOS field effect transistor, such as an EPROM, EEPROM or Flash EEPROM memory cell, nevertheless said memory cell could be a simple MOSFET with threshold voltage adjusted during fabrication, as in the case of a ROM memory cell. When the memory cell MC is biased with said fixed control gate voltage VG, it sinks a current IC whose value depends on the particular programming state of the memory cell itself, i.e. on the memory cell's threshold voltage. In FIG. 1B a current generator G is also shown supplying a reference current IR; IR is not constant, but can take values belonging to a discrete set, as will be now explained.

Figures 2, 3, 4:
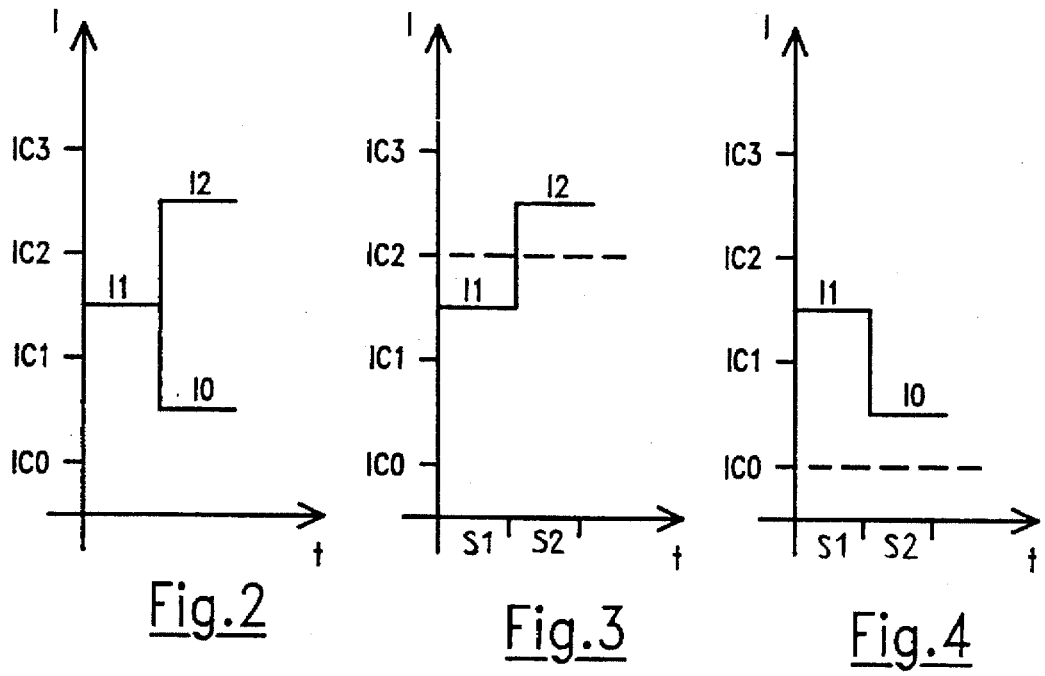
FIG. 2 diagramatically shows the distribution of currents sunk by a four-levels memory cell in its four different programming conditions, and the distribution of reference currents used to sense the memory cell according to the method of the invention.
FIG. 3 and 4 diagramatically show the steps of the sensing method of the invention for two different programming conditions of the memory cell.

In FIG. 2, four distinct values IC0–IC3 for the current IC are shown: each value corresponds to a respective one of the four different programming states of the memory cell MC (practical values can be IC0=0, IC1=15 uA, IC2=30 uA and IC3=45 uA). FIG. 2 also shows, on the branches of a decision tree, the different values that can be taken by the reference current IR: by choosing the reference current values in such a way that they are central between successive values of IC, only three different reference current values I0–I2 are necessary (I0=7.5 uA, I1=22.5 uA and I2=37.5 uA).

Let's assume that the programming state of the memory cell MC corresponds to a current IC=IC2 (FIG. 3). The first step S1 of the sensing method provides for a comparison of the memory cell current IC with a reference current IR=I1, which is the central value in the set of values IC0–IC3; this is the best choice from the point of view of the efficiency of the method. The comparison tells that the cell current IC is higher than I1: a priori it could be equal to IC2 or IC3. In the second step S2 the current IC is compared with a reference current IR=I2, which is the central value between IC2 and IC3, and it is found that IC is lower than I2: necessarily, IC must be equal to IC2. The programming condition of the memory cell MC has thus been determined in only two steps.

Let's now assume, as a second example, that the programming state of the memory cell MC corresponds to a current IC=IC0 (FIG. 4). In the first step S1 the cell current IC is again compared with the reference current IR=I1, to find that IC is lower than I1: this means that IC could be either IC0 or IC1. In the second step S2 the current IC is compared with a reference current IR=I0, which is the central value between IC0 and IC1: since the comparison tells that IC is lower than I0, IC must necessarily be equal to IC0. Again, the programming condition of the memory cell MC has been determined in two steps.

The number of steps required to determine the programming condition of the memory cell MC is uniform, i.e. it does not depend on the programming condition itself, and it is always equal to two (i.e. to the number of bits which can be stored in the memory cell).

Let's now consider the case of a sixteen-level memory cell: FIG. 5 shows the sixteen different values IC0–IC15 for the cell current IC, each value corresponding to a respective one of the sixteen programming levels of the memory cell MC. Similarly to FIG. 2, FIG. 5 also shows on the branches of a decision tree the different values that can be taken by the reference current IR; as in the previous case, the reference current values are chosen to be in central position between successive IC values, so that fifteen different reference current values I0–I14 are necessary.

As a first example, the cell current IC is assumed to be equal to IC12 (FIG. 6). In the first step S1 of the sensing method, the cell current IC is compared with a reference current IR=I7 (the central value in the set IC0–IC15). The comparison tells that IC is higher than I7: this means that the current IC could be equal to one of the values IC8–IC15. In the second step S2, IC is compared with a reference current IR=I11, which is the central value between IC8 and IC15. Again, the comparison tells that IC is higher than I11: this means that IC could be equal to one of the values IC12–IC15. In the third step S3, IC is compared with a reference current IR=I13, which is the central value between IC12 and IC15. The comparison tells that IC is lower than I13: this means that IC could be equal to either IC12 or IC13. In the fourth step S4, IC is compared with a reference current IR=I12, which is the central value between IC12 and IC13. The comparison tells that IC is lower than I12, so IC must necessarily be equal to IC12: the programming condition of the memory cell MC has thus been determined in four steps.

As a further example, the cell current IC is assumed to be equal to IC2 (FIG. 7). In the first step S1 of the sensing method, the cell current IC is compared with the reference current IR=I7. The comparison tells that IC is lower than I7: this means that the current IC could be equal to one of the values IC0–IC7. In the second step S2, IC is compared with a reference current IR=I3, which is the central value between IC0 and IC7. Again, the comparison tells that IC is lower than I3: this means that IC could be equal to one of the values IC0–IC3. In the third step S3, IC is compared with a reference current IR=I1, which is the central value between IC0 and IC3. The comparison tells that IC is higher than I1: this means that IC could be equal to either IC2 or IC3. In the fourth step S4, IC is compared with a reference current IR=I2, which is the central value between IC2 and IC3. The comparison tells that IC is lower than I2, so IC must necessarily be equal to IC2: again, the programming condition of the memory cell MC has thus been determined in four steps.

It has been shown that the sensing method of the present invention allows determination of the programming condition of a four-level memory cells in just two steps, and that of a sixteen-level memory cell in four steps, independently from the particular programming condition of the memory cell. In general, the sensing method of the invention allows determination of the programming condition of a m-levels memory cell (with $m=2^n$) in n steps, independently from the programming condition of the memory cell.

Figure 8:
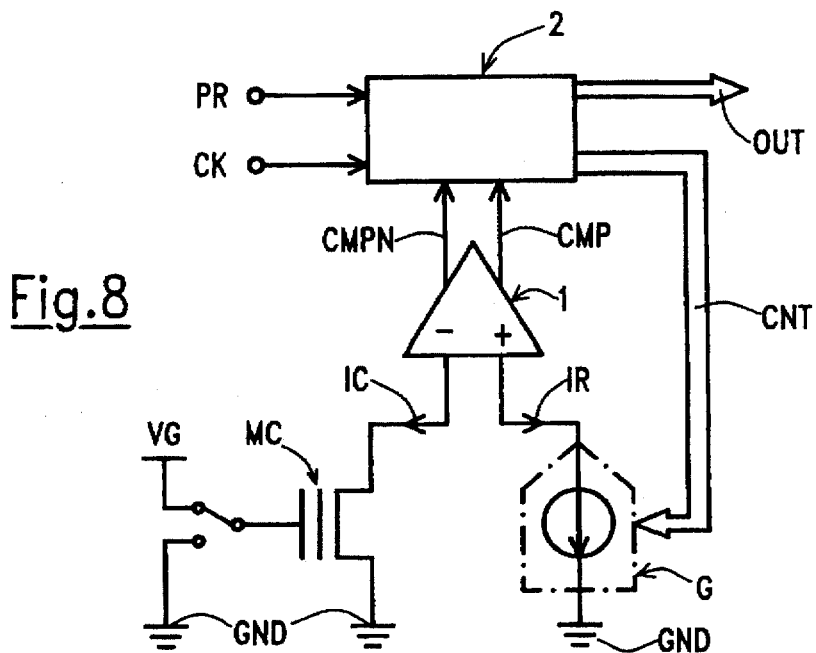
FIG. 8 schematically shows a circuit for sensing multiple-level non-volatile memory cells according to the present invention.

FIG. 8 schematically shows a sensing circuit according to the present invention suitable for implementing the previously described sensing method. The circuit substantially comprises a digitally-driven variable reference current generator G, a current comparator 1 and a Successive Approximation Register ("SAR") 2. The current comparator 1 has an inverting input connected to the drain electrode of a memory cell MC to be sensed, and a non-inverting input connected to the current generator G; the comparator 1 has two output signals CMP, CMPN, one of which is the logic complement of the other, which are supplied to the SAR 2. The SAR 2 is further supplied with a preset signal PR and with a clock signal CK (timing signal), and supplies a group CNT of control signals (in digital format) to the current generator G; the SAR 2 also generates a group OUT of output signals carrying in digital format the programming state of the sensed memory cell MC.

The SAR 2 comprises a sequential network (or state-machine), implementing the successive approximation search, and a combinatorial network. The state of the sequential network at a given step of the successive approximation search depends on its state at the preceding step, and on the result of the comparison between the cell current IC and the reference current IR at the preceding step. On the basis of the state of the sequential network and on the result of the comparison between IC and IR at the last step of the successive approximation search, the combinatorial network provides an output digital code representing the programming state of the memory cell.

Figure 9:
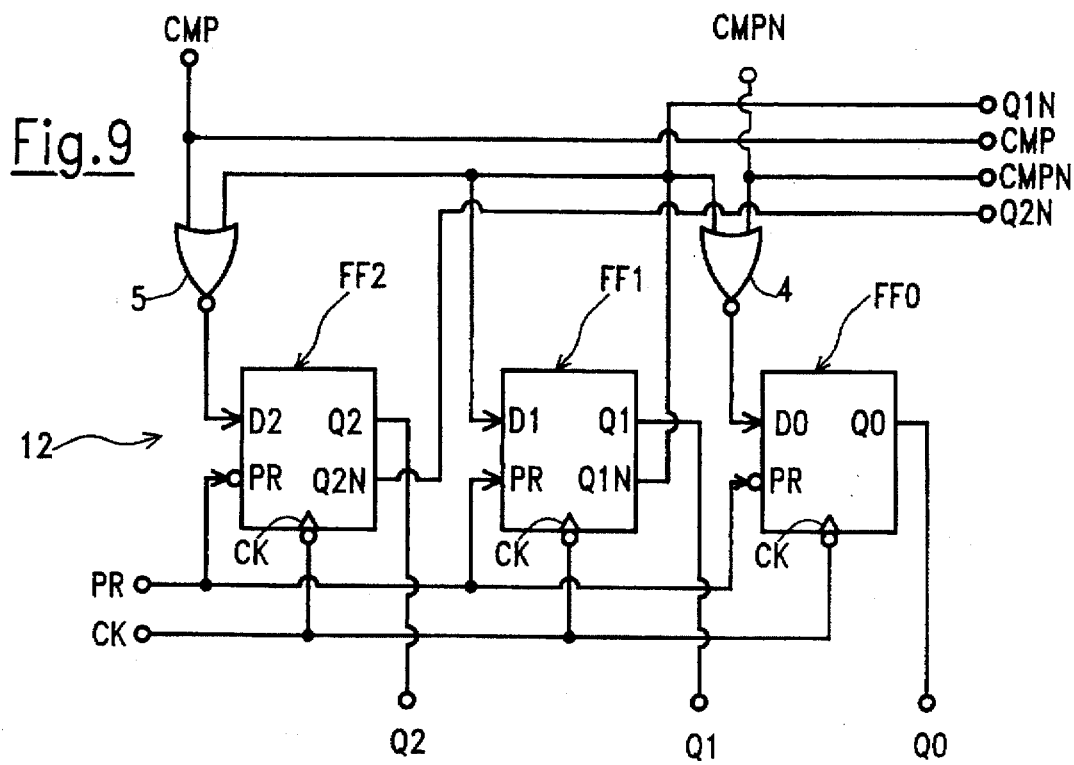
FIG. 9 is a circuit diagram of a Successive Approximation Register (SAR) of the circuit of FIG. 8, suitable for sensing four-level memory cells.

FIG. 9 is a circuit diagram of the sequential network 12 of the SAR 2 in the case the circuit of FIG. 8 is used to sense four-level memory cells (n=2, m=4). The sequential network 12 comprises three Delay-type ("D-type") flip-flops FF0–FF2. Each flip-flop FF0–FF2 has a clock input CK and a preset input PR; the clock inputs CK and the preset inputs PR of the flip-flops FF0–FF1 are commonly connected to the clock signal CK and to the preset signal PR, respectively; more precisely, FF0 and FF2 receive the logical complement of PR (as indicated by the inverting dots at the inputs PR of FF0 and FF2). Each flip-flop has a data input D0–D2, a "true" data output Q0–Q2, and a "complemented" data output Q0N–Q2N (Q0N not shown) which is the logic complement of Q0–Q2; as known to one skilled in the art, in a D-type flip-flop the true data output after a clock pulse takes the logic value of the data input during said clock pulse. The data input D0 of the first flip-flop FF0 is supplied with an output of a NOR gate 4 whose inputs are represented by the signal CMPN and by the complemented data output Q1N of the second flip-flop FF1. The data input D1 of the second flip-flop FF1 is supplied with the complemented data output Q1N of the second flip-flop FF1. The data input D2 of the third flip-flop FF2 is supplied with an output of a NOR gate 5 whose inputs are represented by the signal CMP and by the complemented data output Q1N of the first flip-flop FF1.

Figure 10:
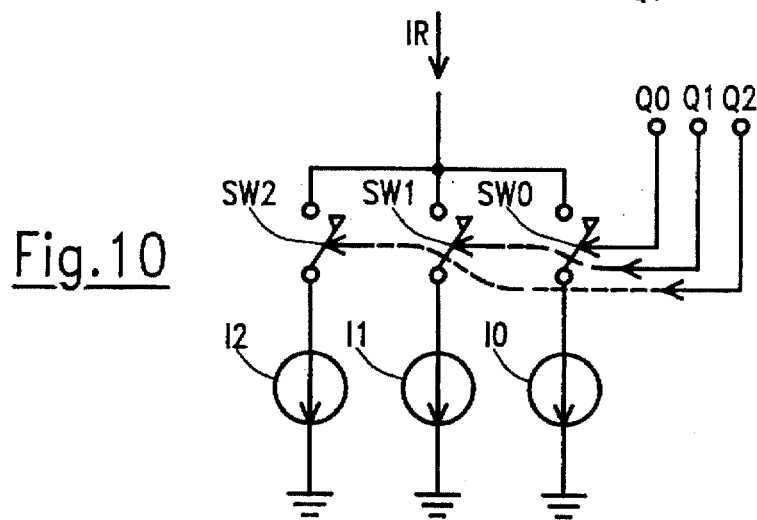
FIG. 10 schematically shows a variable reference current generator of the circuit of FIG. 8, again in the case of four-level memory cells.

The true data outputs Q0–Q2 of the three flip-flops FF0–FF2 form the group of digital control signals CNT for the variable reference current generator G in FIG. 8. The current generator G, shown in FIG. 10, comprises three distinct current generators I0, I1 and I2 connected between ground and a respective switch SW0–SW2; the first switch SW0, in series to I0, is controlled by the signal Q0, the second switch SW1, in series to I1, is controlled by Q1, and the third switch SW2, in series to I2, is controlled by Q2. The switches SW0–SW2 closes when the respective control signal Q0–Q2 is a logic "1", otherwise the switches SW0–SW2 are open.

In practice, the three current generators I0–I2 can be implemented by means of three reference memory cells physically identical to the memory cell MC to be read, but programmed in three different, predefined conditions (not belonging to the programming states of the memory cell MC) so that, when the reference cells are biased in the same manner as the memory cell MC, they sink exactly the desired currents I0, I1 and I2. In this case, the current comparator 1 can be balanced, i.e. the currents to be compared are supplied to the comparator's input in a 1:1 ratio.

As an alternative, if the comparator 1 is properly unbalanced (i.e. if the currents to be compared are supplied to the inverting and non-inverting inputs of the comparator in a ratio different from 1:1), it is not necessary to program the three reference memory cells at ad hoc programming levels different from the m programming levels of the memory cell MC; in this example of a four-level memory cell, the reference memory cells are programmed to sink the current IC1, IC2 and IC3, respectively. The comparator 1 compares the current of the memory cell to be read with a current proportional to that of the reference memory cell. In this way, every possible variation in process parameters or in biasing between the memory cell MC and the reference memory cells is treated as a common-mode contribution, and the programming circuitry is greatly simplified.

Figure 11:
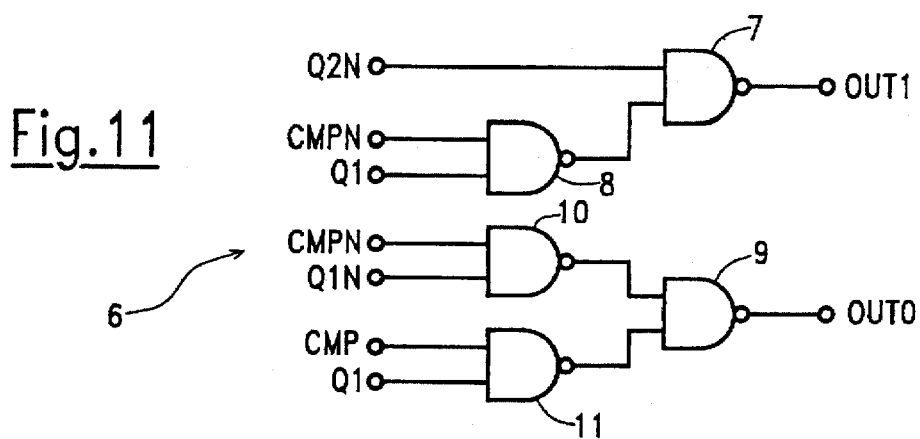
FIG. 11 is a circuit diagram of an encoder of the circuit of FIG. 8.

A combinatorial network 6 of the SAR 2 is shown in FIG. 11. Substantially, the combinatorial network 6 is comprised of an encoder comprising a first NAND gate 7 with a first input supplied with the complemented data output Q2N and a second input supplied with an output of a second NAND gate 8 supplied with the signals CMPN and Q1; the output of the NAND gate 7 forms a most significant bit OUT1 of a two-bits output code OUT0–OUT1. The encoder 6 further comprises a third NAND gate 9 with a first input supplied with an output of a fourth NAND gate 10 in turn supplied with the signals CMPN and Q1N, and a second input supplied with an output of a fifth NAND gate 11 in turn supplied with the signals CMP and Q1. The output of the NAND gate 9 forms a least significant bit OUT0 of the two-bits output code. OUT0 and OUT1 represent the group of signals OUT shown in FIG. 8. As it can be understood from the truth-table in FIG. 12, the combinatorial network 6 implements the following two logic functions:

$$OUT1=Q2+CMPN*Q1$$

$$OUT0=(Q1*CMP)+(Q1N*CMPN).$$

As stated above, N represents a complement signal such that $\overline{Q2}=Q2N$. The equations for OUT1 and OUT0 are derived from FIG. 11 as follows:

| | |
|---|---|
| $OUT1 = \overline{Q2N*(CMPN*Q1)}$ | from FIG. 11 schematic diagram |
| $OUT1 = \overline{Q2N} + \overline{(CMPN*Q1)}$ | de Morgan's law on NAND gate 7 |
| $OUT1 = Q2 + \overline{CMPN*Q1}$ | double negation |
| $OUT0 = \overline{(Q1*CMP)*(Q1N*CMPN)}$ | from FIG. 11 schematic diagram |
| $OUT0 = \overline{(Q1*CMP)} + \overline{(Q1N*CMPN)}$ | de Morgan's law on NAND gate 9 |
| $OUT0 = \overline{(Q1*CMP)} + \overline{(Q1N*CMPN)}$ | double negation |

These two logic functions are, for example, implemented by the circuit of FIG. 11, but other equivalent circuits are possible.

The preset signal PR is used at the circuit power-up to assure that the starting condition of the flip-flops FF0–FF2 is that corresponding to Q0=0, Q1=1 and Q2=0. This condition corresponds to the switch SW1 being closed, i.e., IR=I1 (the central value between IC0 and IC3).

The operation of the sensing circuit will be now described with reference to the truth-table of FIG. 12, to the state-transition diagram of FIG. 13 and to the time diagram of FIG. 14. As previously described in connection with FIGS. 2 to 4, the sensing of a two-levels memory cell MC is carried out in two steps. At the beginning of the first step ($t_0$ in FIG. 14) Q0=Q2=0 and Q1=1, SW0 and SW2 are open and SW1 is closed, so that IR=I1; on the rising edge of the clock signal CK the comparator 1 compares the cell current IC with the reference current IR=I1: if IC is higher than IR, CMP=0 and CMPN=1, while if IC is lower than IR, CMP=1 and CMPN=0. On the falling edge of the clock signal CK, the logic state of Q0–Q2 changes to Q0=Q1=0 and Q2=1 if CMP=0, or to Q0=1 and Q1=Q2=0 if CMP=1 (see FIGS. 13 and 14): in the first case, SW1 opens and SW2 closes, so that IR=I2, while in the second case SW1 opens and SW0 closes, so that IR=I0. On the next rising edge of the clock signal CK, IC is compared to the new value of IR: if IC is higher than IR, CMP=0, while if IC is lower than IR CMP=1. On the basis of the logic state of CMP, Q1 and Q2 the combinatorial circuit 6 can determine the programming state of the memory cell MC; the valid output data OUT0, OUT1 are available at $t_0 + (3/2)T$ (where T is the period of the clock signal CK), i.e. before the end of the second clock pulse. On the next falling edge of the clock signal CK, the flip-flops FF0–FF2 are automatically preset to the state Q0=Q2=0, Q1=1 (self-preset), and the circuit is ready to perform a new sensing.

It is worth noting that the particular circuit solution adopted for the SAR 2, and particularly the provision of the combinatorial network 6 makes the output data OUT0, OUT1 already available after one and a half clock cycles, in the first half of the second period of the clock signal CK (FIG. 14).

Figure 15:
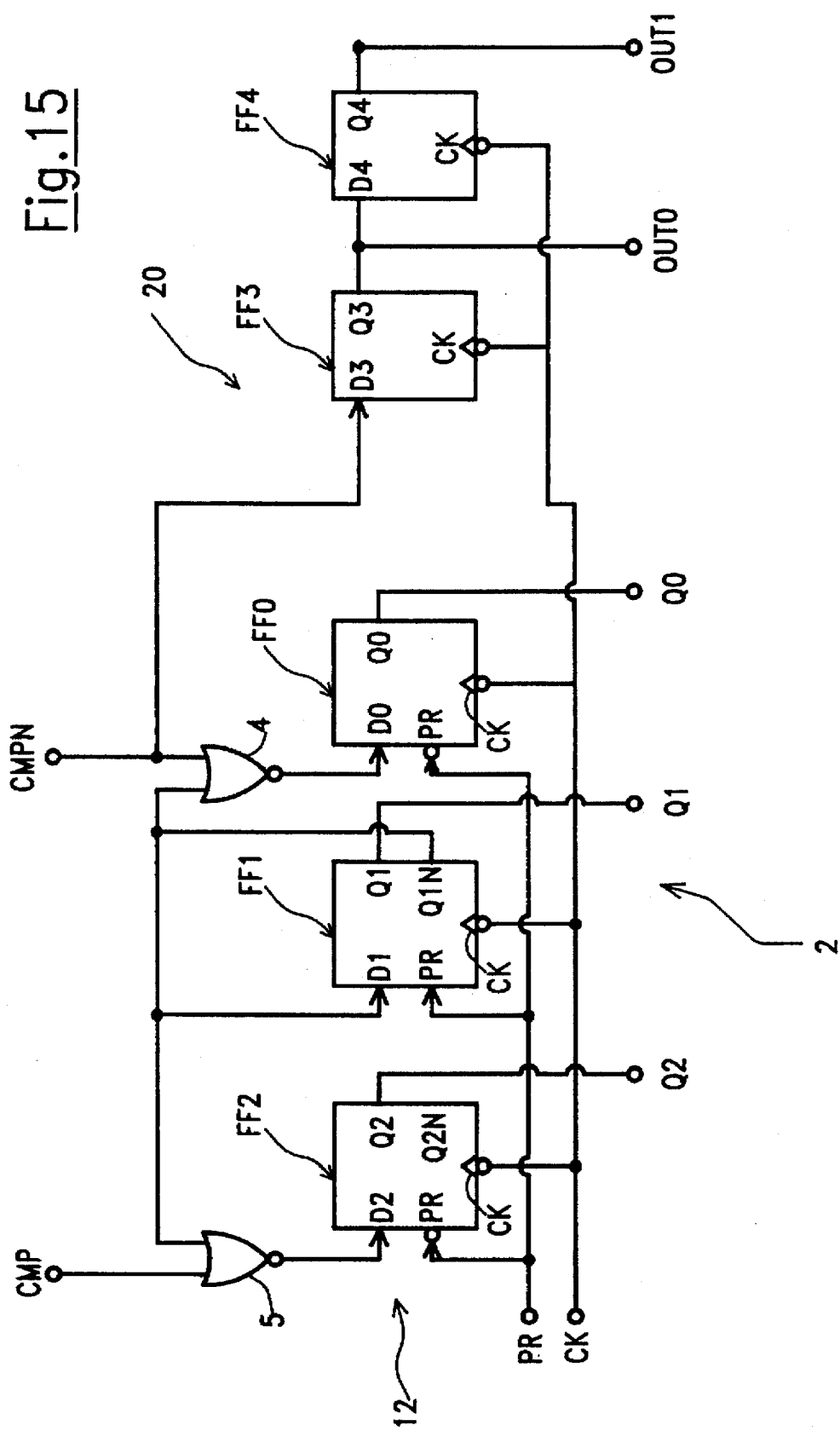
FIG. 15 is a circuit diagram of another embodiment of the SAR of FIG. 8.

FIG. 15 shows an alternate implementation of the Successive Approximation Register 2 particularly suitable for serial memories. The combinatorial circuit 6 has been replaced by a shift register 20 made up of two further flip-flops FF3 and FF4. The first flip-flop FF3 has a data input D3 supplied with the signal CMPN, and the second flip-flop FF4 has a data input D4 supplied with a "true" data output Q3 of the first flip-flop FF3; a "true" data output Q4 of the second flip-flop FF4 forms a serial output OUT1 of the SAR 2. Flip-flops FF3 and FF4 are also supplied with the clock signal CK. As can be seen in the truth-table of FIG. 12, the succession of logic levels of the signal CMPN gives the two-bits word stored in the memory cell MC to be read. At each step of the sensing method, one of the two bits of information stored in the memory cell MC to be read is made available at the output OUT1. The circuit of FIG. 15 also has output OUT0, which, together with OUT1, carry the two-bit code stored in the memory cell MC to be read. In that regard, OUT0 and OUT1 of combinatorial circuit 6 of FIG. 15 are similar to OUT0 and OUT1 of combinatorial circuit 6 of FIG. 6. With this circuit, however, the programming state of the memory cell MC is made available at the outputs OUT0, OUT1 after two full periods T of the clock signal CK, instead of after 3/2 T as in the case of the combinatorial circuit 6.

It should be understood that the structure of the sequential network 12 of the SAR 2 is strictly dependent on the architecture of the reference current generator G. In the current generator G shown in FIG. 10 and described above, only one of the three distinct current generators I0–I2 is enabled at a time: this means that the reference current value is determined by the contribution of only one current generator I0–I2 at a time. Extending the case of a four-level memory cell to that of an m-level memory cell. the variable reference current generator G should comprise m=1 distinct current generators, and the sequential network 12 should comprise m=1 flip-flops, each controlling a respective one of the m=1 current generators.

Another possible architecture for the variable reference current generator G provides for n distinct current generators (two, in the case of a four-level memory cell, and four in the case of a sixteen-level memory cell); such n current generators are "weighted", i.e. the ratio between two of such current generators is a power of two, and each one of the different reference current values is the sum of different contributions. The sequential network will comprise n flip-flops, each one controlling the activation of a respective one of the n current generators. The practical implementation of this architecture, however, poses some problems: supposing that each current generator is represented by a reference memory cell programmed in a predetermined condition, the reference current values are affected by an error which is the sum of slight errors in the programming levels of the reference memory cells; secondly, the equivalence in the electric path between the branch of the memory cell MC and the branch of the variable reference current generator G in FIG. 8 is lost, since the latter branch can be made up of a variable number of reference memory cells connected in parallel, depending on the particular value which must be taken by the reference current IR. Finally, the programming state of the memory cell MC to be read is available at the outputs of the flip-flops of the sequential network after n periods of the clock signal CK, while with the architecture shown in FIGS. 9 to 11 the programming state of the memory cell MC to be read is available at the outputs OUT0, OUT1 of the combinatorial network 6 after n-½ period of the clock signal CK.

From the foregoing it will be appreciated that, although specific embodiments of the invention have been described herein for purposes of illustration, various modifications may be made without deviating from the spirit and scope of the invention. Accordingly, the invention is not limited except as by the appended claims.

We claim:

1. In a multiple-level memory cell capable of storing a program level among a plurality of program levels, a method of obtaining the stored program level of the memory cell, comprising the steps of:

(a) dividing the plurality of program levels into a first portion and a second portion;

(b) comparing the current draw of the memory cell with a reference current to determine whether the stored program level is included in the first portion or the second portion;

(c) selecting the first portion as the plurality of program levels if the stored program level is included in the first portion, and selecting the second portion as the plurality of program levels if the stored program level is included in the second portion;

(d) repeating steps (a)–(c) until the selected portion contains only one program level; and (e) equating the stored program level to the only one program level.

2. The method according to claim 1, prior to step (c), further comprising biasing the memory cell to draw the current representing the stored program level.

3. The method according to claim 2 wherein the reference current is substantially equal to the average of a first current corresponding to a maximum current of the plurality of program levels in the first portion and a second current corresponding to a minimum current of the plurality of program levels in the second portion.

4. The method according to claim 1 wherein the first portion contains the same number of the program levels as the second portion.

5. In a multiple-level memory cell capable of storing a program level among a plurality of program levels, a method of obtaining the stored program level of the memory cell, comprising the steps of:

(a) biasing the memory cell to draw current representing the stored program level;

(b) dividing the plurality of program levels into a first portion and a second portion;

(c) comparing the current draw of the memory cell with a reference current to determine whether the stored program level is included in the first portion or the second portion;

(d) selecting the portion that includes the stored program level as the plurality of program levels; and (e) repeating steps (b), (c), and (d) until the selected portion represents only one program level among the plurality of program levels; and (f) providing the only one program level as the stored program level.

6. In a multiple-level memory cell capable of storing a program level among a plurality of program levels, a circuit for determining the stored program level of the memory cell, comprising:

a variable current generator capable of generating a reference current;

a current comparator having an input connected to the variable current generator, the current comparator for comparing a current drawn by the memory cell with the reference current; and a successive approximation circuit having an input connected to the current comparator and an output connected to the variable current generator, the successive approximation circuit including a sequential network having a plurality of states, the successive approximation circuit being capable of controlling the variable current generator to generate the reference current, whose value corresponds to one state of the sequential network, to successively determine the stored program level of the memory cell.

7. The circuit according to claim 6 wherein starting from an initial state, the sequential network divides the plurality of program levels into a first portion and a second portion, compares the current draw of the memory cell with the reference current to determine whether the stored program level is within the first portion or the second portion, selects the portion that includes the stored program level as the plurality of program levels, and continues to divide compare and select until the selected portion contains only one program level from the plurality of program levels.

8. The circuit according to claim 6 wherein the number of the plurality of program levels equals m and the variable current generator includes n current generators wherein $m=2^n$.

9. The circuit according to claim 6 wherein the number of the plurality of program levels equals m and the variable current generator includes m−1 current generators.

10. The circuit according to claim 9 wherein each current generator includes a reference memory cell having a predetermined current draw for comparing with the current draw of the memory cell to determine whether the stored program level is included in the first portion or the second portion.

11. The circuit according to claim 6 wherein the successive approximation circuit further includes a combinatorial circuit connected to the sequential network and the current comparator to generate an output corresponding to the stored program level of the memory cell.

12. The circuit according to claim 6 wherein the sequential network presets to an initial state when the stored program level is determined.

13. Method for sensing multiple-level non-volatile memory cells which can take one programming level among a group of $m=2^n$ ($n>=2$) different programming levels, providing for biasing a memory cell to be sensed in a predetermined condition, so that the memory cell sinks a cell current with a value belonging to a group of m distinct cell current values, each cell current value corresponding to one of said programming levels, characterized by further providing for:

a) comparing the cell current with a reference current which has a value comprised between a minimum value and a maximum value of said group of m cell current values, thus dividing said group of cell current values in two sub-groups of cell current values, and determining the sub-group of cell current values in which the cell current is included;

b) repeating the step a) until the sub-group of cell current values to which the cell current belongs comprises only one cell current value, which is the value for the current of the memory cell to be sensed.

14. Method according to claim 13, characterized in that said reference current has a value which is substantially halfway between said maximum value and minimum value of said group of cell current values.

15. Circuit for sensing multiple-level non-volatile memory cells which can take one programming level among a plurality of $m=2^n$ ($n>=2$) different programming levels comprising biasing means for biasing a memory cell to be sensed in a predetermined condition, so that the memory cell sinks a cell current with a value belonging to a plurality of m distinct cell current values, each cell current value corresponding to one of said programming levels, and a current comparator for comparing the cell current with a reference current generated by a variable reference current generator, characterized in that it further comprises a successive approximation register supplied with an output signal of the current comparator and controlling the variable reference current generator, the successive approximation register comprising a sequential network which, starting from a predetermined initial state causing the reference current generator to generate a reference current with value comprised between a minimum value and a maximum value of said plurality of cell current values, evolves through a succession of states each one determined by the preceding state and by the output signal of the current comparator, each state of the sequential network causing the reference current generator to generate a respective reference current with value comprised between a minimum value and a maximum value of a sub-plurality of the cell current values to which the cell current belongs.

16. Circuit according to claim 15, characterized in that the variable reference current generator comprises n different current generators whose values increase as powers of two, each state of the sequential network activating a respective sub-set of the n different current generators.

17. Circuit according to claim 15, characterized in that the variable reference current generator comprises a plurality of m−1 different current generators, each state of the sequential network activating one respective current generator of said plurality.

18. Circuit according to claim 17, characterized in that each current generator of said plurality comprises a reference memory cell with a predetermined programming level and biased in a predetermined biasing condition.

19. Circuit according to claim 18, characterized in that the programming levels of the reference memory cells do not belong to the plurality of $m=2^n$ different programming levels of the memory cell to be sensed.

20. Circuit according to claim 18, characterized in that the programming levels of the reference memory cells belong to the plurality of $m=2^n$ different programming levels of the memory cell to be sensed.

21. Circuit according to claim 18, characterized in that said current comparator is unbalanced so that the cell current is compared with a current proportional to a current drawn by one of the reference memory cells.

22. Circuit according to claim 17, characterized in that the successive approximation register further comprises a combinatorial circuit supplied with signals, identifying the state of the sequential network, and with the output signal of the current comparator, and providing n output digital signals carrying the programming level of the memory cell to be sensed.

23. Circuit according to claim 17, characterized in that the successive approximation register further comprises a shift register supplied with the output signal of the current comparator and having a serial output which takes a succession of logic levels each one corresponding to one bit of information stored in the memory cell.

24. Circuit according to claim 17, characterized in that said sequential network automatically presets to said initial state after sensing of a memory cell has been completed.

25. Circuit according to claim 17 for sensing four-levels non-volatile memory cells, characterized in that the sequential network comprises three flip-flops, a first flip-flop having a data output controlling the activation of a first current generator and a data input connected to an output of a first NOR gate which is supplied with a complemented data output of a second flip-flop and with a first output signal of the current comparator, the second flip-flop having a data output controlling the activation of a second current generator and a data input supplied with said complemented data output of the second flip-flop, and a third flip-flop having a data output controlling the activation of a third current generator and a data input connected to an output of a second NOR gate which is supplied with said complemented data output of the second flip-flop and with a second output signal of the current comparator which is the logical complement of said first output signal.

26. Circuit according to claim 25, characterized in that said three flip-flops are supplied with a preset signal activated at the circuit power-up to preset the sequential network in said initial state.

27. Circuit according to claim 26, characterized in that the combinatorial circuit has a first output signal which is the logical sum of the data output of the third flip-flop with the logical multiplication of said first output signal of the current comparator by the data output of the second flip-flop, and a second output signal which is the logical sum of two terms, a first term being the logical multiplication of said second output signal of the current comparator and of said data output of the second flip-flop, and a second term being the logical multiplication of said complemented data output of the second flip-flop and of said first output signal of the current comparator.

28. Circuit according to claim 26, characterized in that said shift register comprises a fourth flip-flop supplied with the first output signal of the current comparator, and a fifth flip-flop supplied with a data output of the fourth flip-flop, a data output of the fifth flip-flop forming said serial output of the shift register.

* * * * *

UNITED STATES PATENT AND TRADEMARK OFFICE
CERTIFICATE OF CORRECTION

PATENT NO. : 5,701,265
DATED : December 23, 1997
INVENTOR(S) : Cristiano Calligaro, et al.

It is certified that error appears in the above-identified patent and that said Letters Patent is hereby corrected as shown below:

In column 11, claim 1 (c), line 5, following "first", please delete ";".

In column 12, claim 7, line 6, following "divide", please insert therefor --,--.

In column 12, claim 15, line 55, following "levels", please insert therefor --,--.

Signed and Sealed this

Twenty-fourth Day of November,1998

Attest:

BRUCE LEHMAN

Attesting Officer

Commissioner of Patents and Trademarks